United States Patent [19]

Marinace

[11] 3,768,151

[45] Oct. 30, 1973

[54] METHOD OF FORMING OHMIC CONTACTS TO SEMICONDUCTORS

[75] Inventor: John C. Marinace, Yorktown Heights, N.Y.

[73] Assignee: International Business Machines Corporation, Armonk, N.Y.

[22] Filed: Nov. 3, 1970

[21] Appl. No.: 86,445

Related U.S. Application Data

[63] Continuation-in-part of Ser. No. 809,783, March 24, 1969, abandoned.

[52] U.S. Cl. ..................... 29/590, 148/178, 148/186

[51] Int. Cl. ..................... B01j 17/00

[58] Field of Search ..................... 29/589, 590; 148/178, 186

[56] References Cited

UNITED STATES PATENTS

| | | | |
|---|---|---|---|
| 3,523,042 | 8/1970 | Bower et al. | 148/187 |
| 3,600,797 | 8/1971 | Bower et al. | 29/584 |
| 3,530,015 | 9/1970 | Autell | 29/578 |
| 3,442,722 | 5/1969 | Bauerlein et al. | 317/235 |
| 3,590,471 | 7/1971 | Lepselter et al. | 29/578 |

*Primary Examiner*—Charles W. Lanham
*Assistant Examiner*—W. Tupman
*Attorney*—Hanifin & Jancin and John A. Jordan

[57] ABSTRACT

Injection lasers are formed from an n type gallium arsenide wafer. A layer of tungsten is deposited on one surface of the wafer. Zinc is diffused from within or through the layer of tungsten to form a junction and an ohmic contact between the zinc diffused region and the tungsten layer. The tungsten itself does not liquify. Nor is there liquification of the combination of the tungsten, gallium arsenide and zinc during the diffusion. The wafer is lapped, ohmic contact is made to the opposite surface, indium is electroplated on the tungsten, and the individual injection laser diodes are cleaved out of the wafer.

29 Claims, 6 Drawing Figures

INVENTOR.
JOHN C. MARINACE

BY John A. Jordan
ATTORNEY

METHOD OF FORMING OHMIC CONTACTS TO SEMICONDUCTORS

BACKGROUND OF THE INVENTION

Field of the Invention

This application is a continuation-in-part of copending application Ser. No. 809,783, filed Mar. 24, 1969, now abandoned.

This invention relates to a method of making ohmic contacts to a body of semiconductor material, and more specifically, to a method of forming such a contact by diffusing from within or through a layer of conductive material into the body of semiconductive material to form a junction in the body and at the same time an ohmic contact between the conductive layer and the body. The method is particularly applied to the fabrication of injection lasers having lasing junctions very near the surface of the semiconductor body.

Prior Art

There are many methods of making ohmic connections to semiconductor bodies. The most prevalent methods use alloy techniques which require that a layer of alloy material be placed on the semiconductor to be contacted, which has already been doped to the desired conductivity type. Heat is then applied to liquify a portion of the alloy material and the semiconductor, and the structure is then cooled to form the ohmic connection. It is also known to form *p-n* junctions during such an alloying process and, in some cases, alloying and diffusion from the alloy material are combined in a single process.

It has also been known to diffuse impurities into materials such as gallium arsenide, through layers of insulating material as taught in U.S. Pat. No. 3,313,663 issued on Apr. 11, 1967, to Tsu-Hsing et al, and U.S. Pat. No. 3,139,362 issued on June 30, 1964 to D'Asaro et al.

However, the prior art methods have not provided a solution to the problem of making a good integral ohmic connection to a body of semiconductor material without some form of liquification of the semiconductor itself. The problem is particularly acute when the ohmic connection is made to small semiconductor devices such as injection lasers where the junction geometry is important and the junction is located very near the surface to which the ohmic connection must be made. In such devices where alloy techniques are used after the junction is formed and the semiconductor material is liquified, the distribution of the liquid is not uniform and the junction is often shorted.

SUMMARY OF THE INVENTION

In accordance with the principles of the present invention, these problems are avoided and good, low resistance, integral contacts are made to a semiconductor body without liquifying the semiconductor material. These contacts are formed by first depositing on one surface of the semiconductor body to be contacted a layer of conductive material which has a high melting point itself, and which does not form a low melting eutectic when in contact with the semiconductor material. This conductive layer exhibits the further property that a particular impurity of one conductivity type can be diffused from within it, or through it, into the semiconductor body, and by this diffusion process, without liquification, an ohmic contact is made between the diffused region and the conductive layer. Where the semiconductor body is originally of opposite conductivity type, the junction is formed in the body by the same diffusion process after the conducting material which is to provide the ohmic contact has been placed on one surface of the body.

More specifically, using gallium arsenide as an example, and the fabrication of injection laser diodes as a particular preferred application of the method, a wafer of *n* type gallium arsenide has deposited on one of its major surfaces a layer of tungsten about 3,000 angstroms thick. Zinc, a *p* type impurity, is then diffused from within or through the tungsten. The tungsten layer of this thickness impedes the diffusion only very slightly. The diffusion produces not only a *p-n* junction formed beneath the surface on which the tungsten has been deposited, but an ohmic connection is also provided between the tungsten layer and the *p* type zinc diffused region. By controlling the time and temperature of the diffusion, the junction can be formed very near the surface of the body, thereby greatly enhancing the heat dissipating properties of the resulting injection lasers. Further, there is no liquification of the tungsten itself nor of the tungsten in contact with the gallium arsenide body. There is, therefore, no possibility of shorting the junction being formed near the surface, and a smooth exposed surface of tungsten in intimate ohmic contact with the *p* region of the laser diode is available for further processing steps. Since there is no liquification, the tungsten surface is smooth which facilitates later processing, particularly making contact to the surface. Materials such as molybdenum, chromium, rhodium and cobalt-tungsten may be employed instead of tungsten, though at the present stage of development of the method, the series resistance is lowest where rhodium, tungsten or molybdenum is used. Further, manganese can also be used, but the surface is not as smooth after the diffusion. Rhodium and cobalt-tungsten (80–20 percent) are especially convenient in some circumstances, because they can be electroplated easily. The depth of the junction as well as other parameters of the device can be controlled by varying the thickness of the layer of tungsten and the time and temperature of the diffusion.

Therefore, it is a broad object of this invention to provide an improved method of making ohmic connections to seniconductor bodies.

It is a further object to provide an improved method of making ohmic contacts to semiconductor devices which require a junction close to the surface at which the ohmic contact is to be made.

Another more specific object is to provide an improved method of fabricating injection laser diodes.

The foregoing and other objects, features and advantages of the invention will be apparent from the following more particular description of preferred embodiments of the invention, as illustrated in the accompanying drawings.

DESCRIPTION OF PREFERRED EMBODIMENT

Figure 1A:
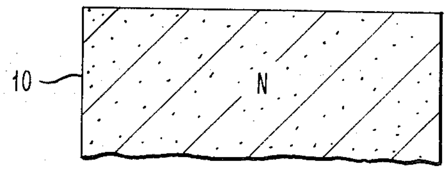
FIGS. 1A, 1B, 1C and 1D illustrate the steps of the method as applied to the preferred embodiment of fabricating improved injection laser diodes.

The inventive method is here illustrated as applied to the preferred application, the fabrication of improved gallium arsenide injection lasers. FIGS. 1A, 1B, 1C, and 1D, illustrate the various steps of the method as applied to a wafer of gallium arsenide from which a number of injection lasers are to be fabricated. The wafer is designated 10 in FIG. 1A, and in accordance with the first step of the process, is prepared to be *n* type, doped with tin to a concentration of about $2 \times 10^{18}$ atoms per $cm^3$. The next step in the process is to deposit, by vacuum evaporation, a layer 12 of tunsten having a thickness of about 3,000 angstroms. This layer 12 may be deposited by other methods including pyrolitic deposition.

The wafer 10 with tungsten coating 12 is then placed in a silica ampoule along with a diffusant source of $ZnAs_2$. The ampoule is held at 850° C for about 2 hours to carry out the diffusion of the *p* type impurity zinc. It has been found that the zinc diffuses, almost unimpeded through the tungsten layer, and that the junction region formed by zinc diffusion through the tungsten layer is about 25 microns from the surface of the gallium arsenide. Where the zinc diffused through the surfaces uncovered by tungsten, the junction was 28 microns below the surface.

Figure 1B:
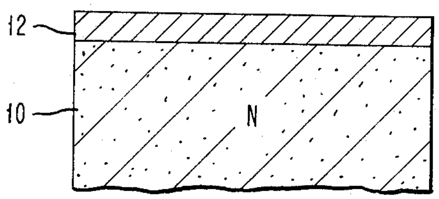
Figure 1C:
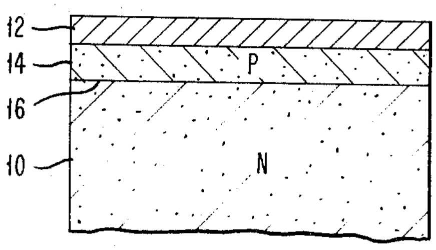
Figure 1D:
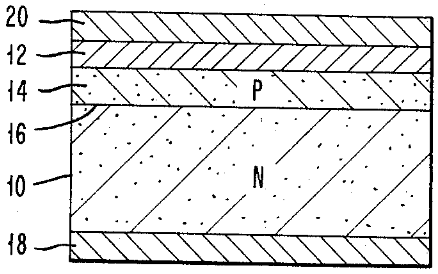

In FIG. 1C, only the *p* type region produced by the zinc diffusion through the tungsten is shown and this layer is designated 14. At the interface of this layer with the *n* type bulk of the body of gallium arsenide, a *p-n* junction 16 is formed. As is the usual case for injection lasers, junction 16 is not a sharp and abrupt junction. During the diffusion step, here carried out at 850° C, the tungsten itself which has a high melting point, does not liquify and there is no evidence of any liquification of the tungsten and gallium arsenide at their point of contact. Further the diffusion step not only provides the junction 16, but causes an ohmic contact to be made between the tungsten layer 12 and the zinc diffused region 14. The excess zinc concentration in the diffused region 14 varies from about $2 \times 10^{20}$ atoms per $cm^3$ at the surface adjacent the tungsten layer to about $2 \times 10^{18}$ atoms per $cm^3$ at the junction 16. The diffusion is believed to also produce a concentration of zinc in the tungsten layer.

After the diffusion step, the bottom surface of wafer 10 is lapped to provide a wafer thickness of about 100 microns, and an ohmic contact 18 is made to this surface by conventional indium alloying techniques. A layer 20 of indium is then electroplated on top of tungsten layer 12, to complete the upper contact structure. Thereafter, using conventional techniques, individual laser diodes are cleaved out of the complete structure shown in FIG. 1D. Individual connections are made to the indium contacts 18 and 20 on the cleaved devices.

Measurement of the series resistance of the ohmic contacts formed by the diffusion through tungsten, as described above, have produced values of about 60 millihohms. Further the surfaces of the tungsten layer 12 after the diffusion, but prior to the application of the indium contact layer, were observed to be very smooth. This is an advantage in those applications where it is desired to make a pressure contact directly to the tungsten layer 12.

The process, as described above, with reference to FIGS. 1A–1D has also been carried out using instead of tungsten for layer 12, any one of molybdenum, chromium, manganese, rhodium or cobalt-tungsten. The results achieved with molybdenum were essentially the same as for tunsten. The structures prepared using chromium exhibited a higher series resistance of about 300 millihohms.

The device in the structure prepared as described above had the *p-n* junction about 25 microns from the upper surface. When such a device is operated as a laser, the lasing cavity extends along this junction essentially parallel to the upper surface of the structure. Since heat dissipation is a considerable problem in devices of this type, it is desirable to place the lasing junctions as close to the surface as possible thereby facilitating the required rapid removal of heat which is produced at the junction. The junction depth can be varied by varying the thickness of the tungsten layer 12. The preferable range for the devices under consideration here is from about 1,000 angstroms to 10,000 angstroms.

The depth of the junction can also be controlled by control of the diffusion parameters. Deeper junctions, at about a depth of 32 microns, have been produced by diffusion through a 3,000 angstrom tungsten layer. In this case the zinc pressure during the diffusion was about the same as for the diffusion described above, but the temperature was held at 750° C for 16 hours, followed by a temperature of 850° C for 1 ¼ hours. The more desirable junctions right below the surface, 5 microns or less from the surface, can be produced by a proper control of the same diffusion parameters. Thus, junctions no more than 5 microns from the surface have been produced by diffusion of zinc at a lower zinc pressure and using a temperature cycle of 4 hours heating at 750° C followed by 45 minutes heating at 850° C.

As has been pointed out above, it is essential in devices of this type with junctions required to be formed very close to the surface that the inventive method has particular application. However, the method is also advantageous in the fabricating of deeper lying junctions and, in fact, in making ohmic contact to other types of semiconductors and semiconductor devices, both with and without a junction. For example, the process has been practiced using tungsten layers on gallium phosphide and gallium aluminum arsenide. The diffusion technique is simple and liquification of the semiconductor is avoided. It is also possible in some applications to form the layer of conductive material as a laminate of individual layers of different material.

It is also apparent that the practice of the method is not limited to the fabrication of discrete devices, but can be applied to fabrication of integrated structures which include a number of different devices. For example, a plurality of separate injection lasers can be fabricated in a single gallium arsenide wafer using conventional masking techniques to lay down the tungsten or other conductive material, and carrying out the above-described diffusion process to form the junctions in the individual devices and at the same time the ohmic connection to the diffused region on one side of the junction.

Figure 2A:
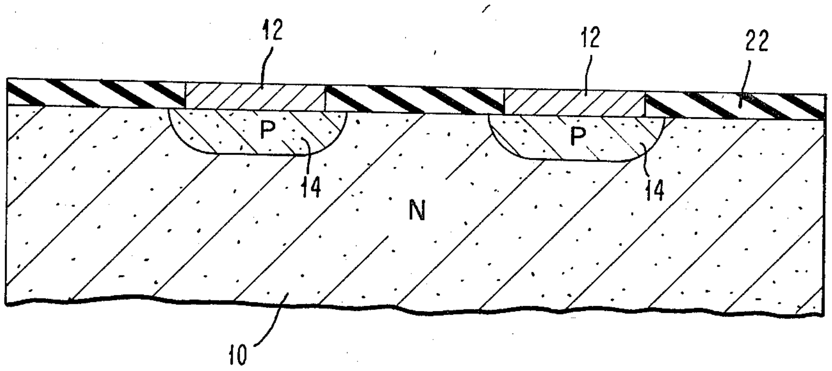
FIGS. 2A and 2B depict an arrangement illustrating a further embodiment in accordance with the principle of the method of the present invention.

With reference to FIG. 2A there is shown an arrangement to be used in describing a particular alternative method for making, for example, integrated arrays of GaAs lasers. Again, wafer 10 is an n type GaAs wafer doped with tin to a concentration of about $2 \times 10^{18}$ atoms per $cm^3$. A film 22 of $Al_2O_3$ is deposited on the polished surface of the wafer 10 to a thickness of about 1,000 A. Conventional photolithography techniques can then be used to etch narrow parallel slots in the $Al_2O_3$ film 22. If wafer 10 is of the {100} orientation, the axes of the slots are in one of the [110] directions in the {100} plane. A conventional electroplating process may then be used to deposit, for example, rhodium metal layer 12 in the slots in the $Al_2O_3$ films. The thickness of the rhodium can be less than or more than the thickness of the $Al_2O_3$ film 22. Zinc diffusions are carried out in substantially the same manner as hereinabove described. To obtain shallow *p*-regions 14, a restricted amount of zinc diffusant is used, and the ampoule, containing wafers, is held at 750° C for 2 hours and then at 850° C for 1/2 hour. The resulting depths of region 14 are, then, 2 or 3 microns.

Following the diffusion step, the resulting device is processed as described hereinabove. The wafer 10 is lapped from the bottom side until its thickness is about 100 microns. Then an ohmic contact is made to the bottom of wafer 10 as before. In particular, Au, tin, and In are plated on the wafer and the wafer is then briefly sintered at 450° C, in a non-oxidizing atmosphere. Indium is then electroplated on the sintered contact, on the bottom of the wafer, and to the rhodium strips, on the upper surface of the wafer. The wafer is cleaved into bars whose axes are perpendicular to the axes of the rhodium strips. The bars are then sawed to the desired length, and they are then ready for mounting in a laser-array header.

Figure 2B:
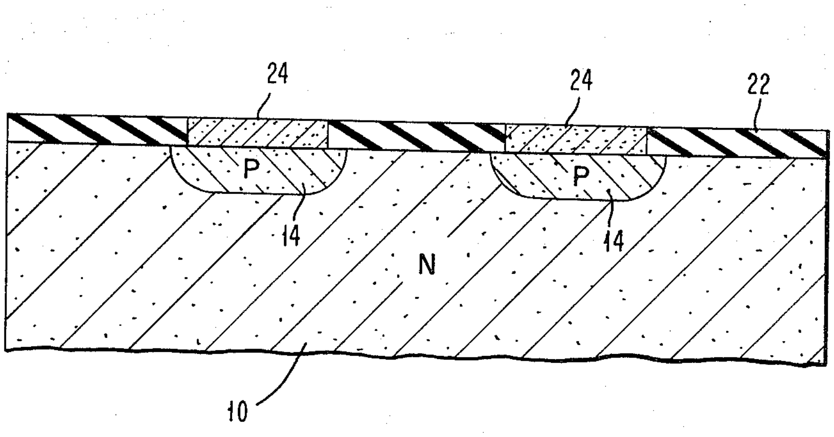

With reference to FIG. 2B there is shown an alternative way of diffusing, in accordance with the principles of the present invention. The particular structure and processing embodying the method are similar to those described with reference to FIG. 2A. In this case, however, the diffusant impurity is distributed within the bulk of the metal layer, designated 24, filling the slots in the $Al_2O_3$ film 22. The impurity may be distributed homogeneously or, as a separate phase. For example, to obtain a homogeneous distribution zinc could be electroplated at the same time as rhodium, in whatever concentrations that would be desirable. To incorporate zinc as a separate phase, a small amount of rhodium could first be deposited. Then, the desired amount of zinc could be deposited, and finally a final layer of rhodium could be deposited.

On the other hand, in the arrangement shown in FIG. 1B, wherein the refractory metal is deposited by evaporation or sputtering, the desired diffusant impurity could be co-deposited with the refractory metal to obtain a homogeneous distribution. Alternatively, by evaporation or sputtering a first thin layer of metal could be deposited which is, in turn, followed by deposition of a thin layer of the desired impurity, the latter then being followed by deposition of a final layer of refractory metal.

While the invention has been particularly shown and described with reference to the preferred embodiment thereof, it will be understood by those skilled in the art that various changes in form and details may be made therein without departing from the spirit and scope of the invention.

What is claimed is:

1. A method of making an ohmic contact to a body of semiconductor material and at the same time forming a junction in said body, comprising the steps of:

providing on at least one portion of one surface of said body a layer of conductive material;

diffusing into the said at least one portion of one surface of the body impurity atoms different than those of said conductive material of one conductivity determining type without exceeding the temperature at which said conductive material reacts with said semiconductor material or liquifies either by itself or in contact with said semiconductor material;

and controlling the time and temperature of said diffusion so as to form in said body a region adjacent said surface doped with said impurity atoms of one conductivity determining type which is ohmically connected to said layer of conductive material and which forms a junction with the remainder of said body.

2. The method as set forth in claim 1 wherein the step of diffusing impurity atoms comprises diffusing impurity atoms through said layer of conductive material.

3. The method as set forth in claim 1 wherein the step of diffusing an impurity comprises diffusing said impurity from within said layer of conductive material.

4. The method as set forth in claim 1 wherein said layer of conductive material exhibits a pattern formed by the steps of laying down an insulating layer on said surface and etching said pattern through said insulating layer on said surface to form said pattern for thereby defining and forming the pattern desired for said conductive material.

5. The method as set forth in claim 4 wherein said layer of conductive material is electroplated on said surface.

6. The method as set forth in claim 4 wherein said layer of conductive material is sputtered onto said surface simultaneously with the sputtering of said impurity.

7. The method as set forth in claim 1 wherein said layer of conductive material is selected from the group consisting of tungsten, molybdenum, chromium, manganese, rhodium, and cobalt-tungsten.

8. The method as set forth in claim 1 wherein the said at least one portion of said body into which said impurity atoms of one conductivity determining type are diffused is originally doped to be of opposite conductivity type thereto and said diffusion produces a *p-n* junction in said body.

9. The method as set forth in claim 8 wherein said semiconductor material is gallium-arsenide, and said impurity is zinc.

10. The method as set forth in claim 9 wherein said layer of conductive material is tungsten.

11. The method as set forth in claim 9 wherein said layer of conductive material is molybdenum.

12. The method as set forth in claim 9 wherein said layer of conductive material is chromium.

13. The method as set forth in claim 9 wherein said layer of conductive material is rhodium.

14. The method as set forth in claim 9 wherein said layer of conductive material is cobalt-tungsten.

15. The method as set forth in claim 9 wherein said layer of conductive material is manganese.

16. A method of making an ohmic contact to a body of semiconductor material and at the same time forming a junction in said body, comprising the steps of:

providing on at least one portion of one surface of the body a layer of conductive material selected from the group consisting of tungsten, molybdenum, chromium, manganese, rhodium and cobalt-tungsten;

diffusing into the said at least one portion of one surface of the body impurity atoms different than those of said conductive material of one conductivity determining type without exceeding the temperature at which said conductive material reacts with said semiconductor material or liquifies either by itself or in contact with said semiconductor materials;

and controlling the time and temperature of said diffusion to thereby form in said body a region adjacent to said surface doped with said impurity atoms of one conductivity determining type which is ohmically connected to said layer of conductive material and which forms a junction with the remainder of said body.

17. The method as set forth in claim 16 wherein the step of diffusing impurity atoms comprises diffusing impurity atoms through said layer of conductive material.

18. The method as set forth in claim 16 wherein the step of diffusing an impurity comprises diffusing an impurity from within said layer of conductive material.

19. A method of fabricating a junction in a body of semiconductor material and at the same time making ohmic contact to a region of one conductivity type on one side of said junction, comprising the steps of:

providing a body of semiconductor material having at least a first region having one surface extending to one surface of said body which region is doped to be of opposite conductivity type to said one conductivity type;

forming on at least a portion of said one surface of said first region a layer of conductive material which does not substantially impede the diffusion of impurity atoms different than those of said conductive material which form said one conductivity type;

diffusing into the said at least a portion of said one surface of said first region said impurity atoms so as to form a diffused region therein of said one conductivity type without exceeding the temperature at which said conductive material reacts with said semiconductor material or liquifies either by itself or in contact with said semiconductor materials;

and controlling the time and temperature of said diffusion to both form a *p-n* junction in said semiconductor body at least between said diffused region of one conductivity type and said first region and at the same time form an ohmic contact between said diffused region of one conductivity type and said layer of conductive material.

20. The method as set forth in claim 19 wherein the time and temperature of said diffusion is controlled to form said *p-n* junction at a distance from said one surface which is equal to or less than 5 microns.

21. The method as set forth in claim 20 wherein said body of semiconductive material is a body of gallium arsenide, said first region is *n*-type, and said particular impurity is zinc.

22. The method as set forth in claim 21 wherein said layer of conductive material is selected from the group consisting of tungsten, molybdenum, chromium, manganese, rhodium and cobalt-tungsten.

23. A method of fabricating an injection laser having a lasing junction near one surface of a semiconductor body whereby lasing is produced along that junction, comprising the steps of:

providing a body of gallium arsenide including at least a first region extending to said one surface which is doped to be *n* type;

forming on at least a portion of said one surface adjacent said first region a layer of tungsten;

and diffusing zinc atoms into the said at least a portion of said one surface adjacent said first region to form a *p*-type region in said first *n*-type region and a *p-n* junction therebetween;

said diffusion being carried out below the temperature at which said tungsten liquifies or reacts with said gallium arsenide and producing an ohmic connection between said layer of tungsten and said diffused p-type region.

24. The method of claim 23 wherein the time and temperature of said diffusion is controlled relative to the thickness of said layer of tungsten to form said *p-n* junction at a distance less than 25 microns from said one surface.

25. The method of claim 24 wherein said *p-n* junction is formed at a distance from said one surface which is equal to or less than 5 microns.

26. The method of claim 25 wherein the thickness of said layer of tungsten is about 3,000 angstroms.

27. The method of claim 26 wherein the temperature of said diffusion does not exceed 850° C.

28. The method of claim 23 wherein the step of diffusing comprises diffusing through said layer of tungsten.

29. The method of claim 23 wherein the step of diffusing comprises diffusing from within said layer of tungsten.

* * * * *